US011177206B2

(12) United States Patent
Lee et al.

(10) Patent No.: US 11,177,206 B2
(45) Date of Patent: Nov. 16, 2021

(54) DOUBLE-SIDED FLEXIBLE CIRCUIT BOARD AND LAYOUT STRUCTURE THEREOF

(71) Applicant: CHIPBOND TECHNOLOGY CORPORATION, Hsinchu (TW)

(72) Inventors: Chun-Te Lee, Hsinchu County (TW); Chih-Ming Peng, Taichung (TW); Hui-Yu Huang, Hsinchu (TW); Yin-Chen Lin, Miaoli County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 33 days.

(21) Appl. No.: 16/833,826

(22) Filed: Mar. 30, 2020

(65) Prior Publication Data

US 2021/0159159 A1 May 27, 2021

(30) Foreign Application Priority Data

Nov. 21, 2019 (TW) ................................. 108142280

(51) Int. Cl.
*H01L 23/498* (2006.01)
*H01L 23/00* (2006.01)

(52) U.S. Cl.
CPC .... *H01L 23/49838* (2013.01); *H01L 23/4985* (2013.01); *H01L 24/16* (2013.01); *H01L 2224/16225* (2013.01)

(58) Field of Classification Search
CPC ............. H01L 51/0097; H01L 23/4985; H01L 23/49572; H01L 23/49855
See application file for complete search history.

(56) References Cited

U.S. PATENT DOCUMENTS

| 10,504,830 B2* | 12/2019 | Lee ..................... H01L 23/4824 |
| 2013/0277095 A1 | 10/2013 | Lin et al. |
| 2014/0131889 A1* | 5/2014 | Kim ...................... H01L 23/552 |
| | | 257/774 |

(Continued)

FOREIGN PATENT DOCUMENTS

| CN | 200638823 A | 11/2006 |
| TW | 201513748 A | 4/2015 |
| TW | 201940027 A | 10/2019 |

OTHER PUBLICATIONS

Taiwanese Office Action dated Jun. 18, 2020 for Taiwanese Patent Application No. 108142280, 4 pages.

*Primary Examiner* — Nicholas J Tobergte
(74) *Attorney, Agent, or Firm* — Demian K. Jackson; Jackson IPG PLLC

(57) ABSTRACT

A layout structure of double-sided flexible circuit board includes a flexible substrate having a first surface and a second surface, a first circuit layer and a second circuit layer. An inner bonding region is defined on the first surface and an inner supporting region is defined on the second surface according to the inner bonding region. The first circuit layer is located on the first surface and includes first conductive lines which each includes an inner lead located on the inner bonding region. The second circuit layer is located on the second surface and includes second conductive lines which each includes an inner supporting segment located on the inner supporting region. A width difference between any two of the inner supporting segment of the second conductive lines is less than 8 μm.

18 Claims, 3 Drawing Sheets

(56) References Cited

U.S. PATENT DOCUMENTS

| | | | |
|---|---|---|---|
| 2016/0218065 A1* | 7/2016 | Ha | H01L 23/4985 |
| 2018/0027651 A1* | 1/2018 | Lim | H05K 3/18 361/749 |
| 2019/0352548 A1* | 11/2019 | Liang | C09J 153/02 |
| 2020/0187367 A1* | 6/2020 | Higby | H05K 3/4691 |
| 2020/0196453 A1* | 6/2020 | Kim | H01L 23/49838 |

* cited by examiner

DOUBLE-SIDED FLEXIBLE CIRCUIT BOARD AND LAYOUT STRUCTURE THEREOF

FIELD OF THE INVENTION

This invention relates to a double-sided flexible circuit board, and more particularly to a layout structure of a double-sided flexible circuit board.

BACKGROUND OF THE INVENTION

Layout structures on top and bottom surfaces of a conventional double-sided flexible circuit board 200 are indicated by solid lines and dotted lines in FIG. 1, respectively. The conventional double-sided flexible circuit board 200 includes a flexible substrate 210, first conductive lines 220 and second conductive lines 230. The first conductive lines 220 and the second conductive lines 230 are located on the top and bottom surfaces of the flexible substrate 210, respectively. A chip mounting region 211 and bump mounting regions 212 are defined on the top surface of the flexible substrate 210, the bump mounting regions 212 are located within the chip mounting region 211 where a chip of a flip chip device (not shown) is mounted. Bumps on the chip are mounted on the bump mounting regions 212 one to one for electrically connecting to inner leads 221 of the first conductive lines 220. A supporting region is defined on the bottom surface of the flexible substrate 210 by a profile of the chip mounting region 211, and supporting segments 231 of the second conductive lines 230 are located on the supporting region. For bonding the flip chip device to the flexible circuit board 200, the bumps of the chip are aligned to the bump mounting regions 212 on the flexible substrate 210, and a thermal bonding head is provided to compress the back surface of the chip to allow the bumps on the chip to connect with the inner leads 221.

The supporting segments 231 of the second conductive lines 230, which are located under the chip mounting region 211, are able to support the inner leads 221 on the flexible substrate 210 when the chip is compressed by the thermal bonding head. As shown in FIG. 1, the supporting segments 231 on the supporting region have different widths for different purposes, such as signal transmission, power voltage transmission or dummy pattern. Ideally, the supporting segments 231 with different widths are designed to have same height to display good flatness for the chip when compressed by the thermal bonding head. However, in practice, the height deviation of the wider conductive lines is higher than that of the narrower conductive lines, in other words, the wider supporting segments 231 may have a higher height than the narrow supporting segments 231. The thermal bonding head may apply different forces on the bumps of the chip to cause bonding failure because of the supporting segments 231 with poor flatness.

SUMMARY

The present invention discloses a double-sided flexible circuit board and a layout structure thereof. Inner bonding region of the double-sided flexible circuit board has a sufficient flatness for inner lead bonding owing to inner supporting segments on inner supporting region, which under inner bonding region, have less difference in width.

A layout structure of a double-sided flexible circuit board of the present invention includes a flexible substrate having a first surface and a second surface, a first circuit layer and a second circuit layer. An inner bonding region is defined on the first surface and an inner supporting region is defined on the second surface by a profile of the inner bonding region. The first circuit layer is located on the first surface and includes a plurality of first conductive lines, each of the first conductive lines includes an inner lead which is located on the inner bonding region. The second circuit layer is located on the second surface and includes a plurality of second conductive lines, each of the second conductive lines includes an inner supporting segment which is located on the inner supporting region. A width difference between any two of the inner supporting segment of the second conductive lines is less than 8 μm.

By narrowing down the width difference between any two of the inner supporting segments in the inner supporting region, the height of any one of the inner supporting segments is controlled to similar to one another such that the inner supporting segments have well flatness for thermal bonding head in ILB (Inner lead bonding) process.

DETAILED DESCRIPTION OF THE INVENTION

Figure 1:
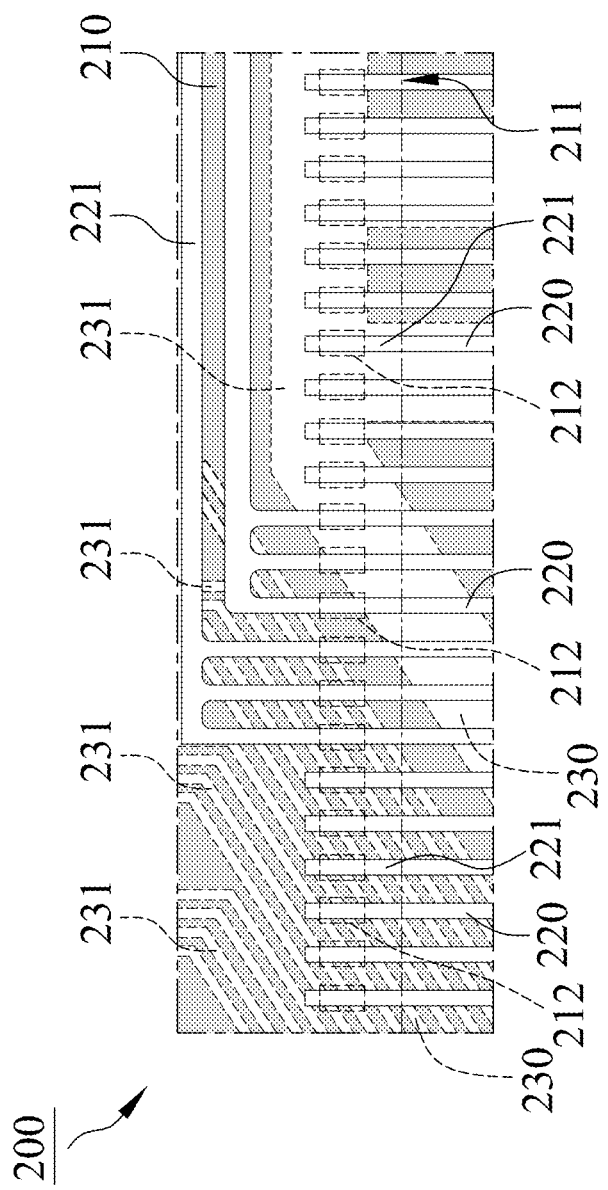
FIG. 1 is a partial schematic diagram illustrating a conventional double-sided flexible circuit board.
Figure 2:
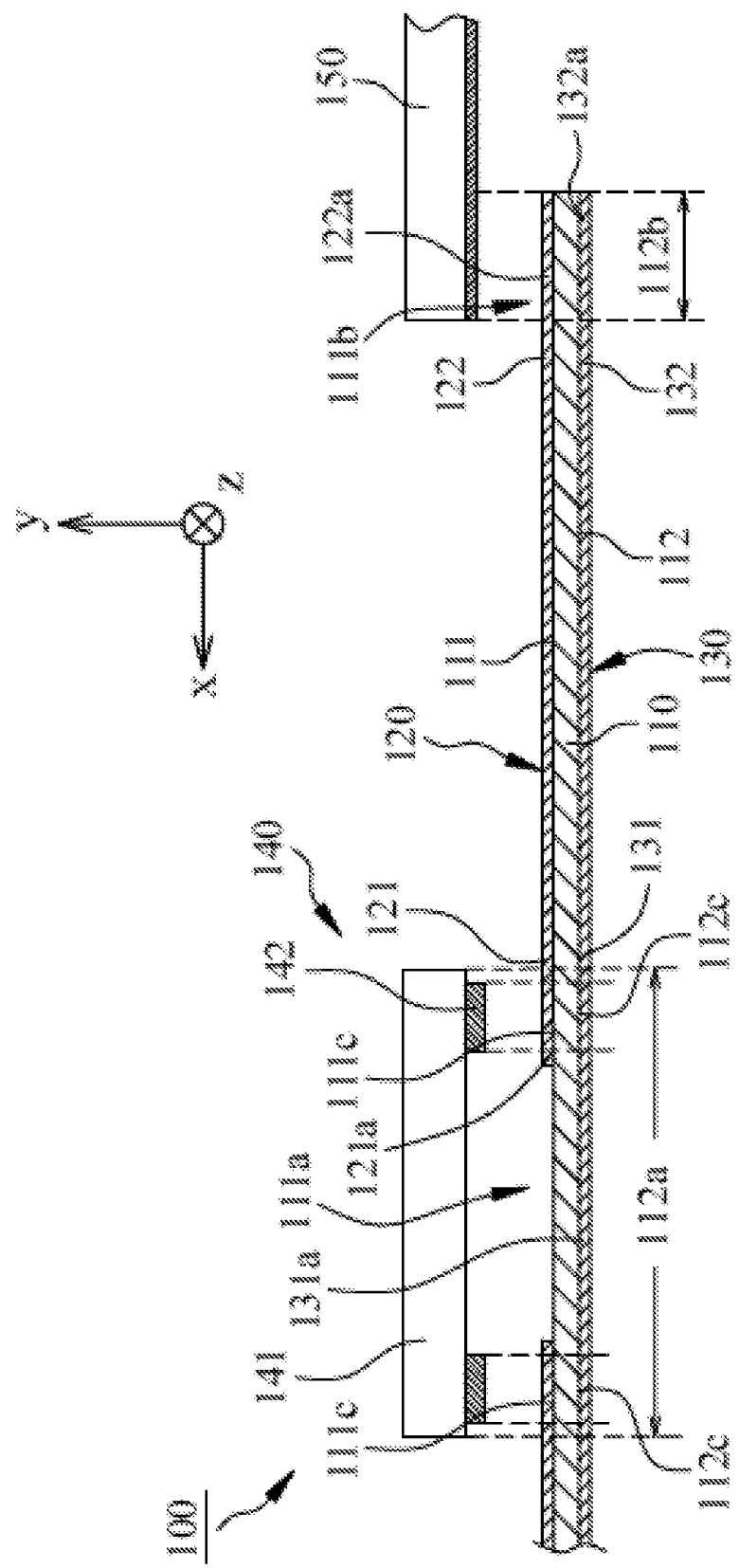
FIG. 2 is a cross-section view diagram illustrating a double-sided flexible circuit board in accordance with one embodiment of the present invention.

FIG. 2 is a cross-section view diagram showing a double-sided flexible circuit board 100 of the present invention. The double-sided flexible circuit board 100 includes a flexible substrate 110 having a first surface 111 and a second surface 112, a first circuit layer 120, a second circuit layer 130, a flip chip device 140 and a circuit device 150. An inner bonding region 111a and an outer bonding region 111b are defined on the first surface 111 for the flip chip device 140 and the circuit device 150, respectively. An inner supporting region 112a is defined on the second surface 112 by a profile of the inner bonding region 111a, and an outer supporting region 112b is defined on the second surface 112 by a profile of the outer bonding region 111b. The flexible substrate 110 may be made of polyimide or other polymers having excellent insulation, stability, etch resistance and mechanical property.

The first circuit layer 120 is located on the first surface 11 of the flexible substrate 110 and is formed by etching a copper layer which is plated or cladded on the first surface 111, and in this embodiment, the first circuit layer 120 includes a plurality of first conductive lines 121 and a plurality of fourth conductive lines 122. Each of the first conductive lines 121 and each of the forth lines 122 may be the same conductive line or different conductive lines configured for signal transmission, or may be dummy patterns not for signal transmission. Each of the inner conductive lines 121 includes an inner lead 121a located on the inner bonding region 111a of the first surface 111, and each of the fourth conductive lines 122 includes an outer lead 122a located on the outer bonding region 111b of the first surface 111. The flip chip device 140 is mounted on the inner bonding region 111a and electrically connected to the inner lead 121a, and the circuit device 150 is mounted on the outer bonding region 111b and electrically connected to the outer lead 122a.

The second circuit layer 130 is located on the second surface 112 of the flexible substrate 110 and is also formed by etching a copper layer which is plated or cladded on the second surface 112, and the second circuit layer 130 includes a plurality of second conductive lines 131 and a plurality of third conductive lines 132 in this embodiment. Each of the second conductive lines 131 and each of the third conductive lines 132 may be the same line or different lines for signal transmission, or dummy patterns not for signal transmission. Further, the second conductive lines 131 and the third conductive lines 132 can be electrically connected to the first conductive lines 121 and the fourth conductive lines 122 on the first surface 111 through vias (not shown) in the flexible substrate 110. Each of the second conductive lines 131 includes an inner supporting segment 131a located in the inner supporting region 112a of the second surface 112, and each of the third conductive lines 132 includes an outer supporting segment 132a located in the outer supporting region 112b of the second surface 112.

With reference to FIG. 2, the flip chip device 140 includes a chip 141 and a plurality of bumps 142, and the circuit device 150 is a printed circuit board or glass substrate. Each of the bumps 142 of the flip chip device 140 is electrically connected to the inner lead 121a of each of the first conductive lines 121, and the chip 141 is electrically connected to the bumps 142 such that the chip 141 can delivery signals to or receive signals from the circuit device 150 via the bumps 142, the first conductive lines 121 and the fourth conductive lines 122. Preferably, the bumps 142 of the flip chip device 140 are bonded to the inner lead 121a of the first conductive lines 121 by thermal bonding in inner lead bonding (ILB) process, and the circuit device 150 is bonded to the outer lead 122a of the fourth conductive lines 122 by anisotropic conductive film (ACF) in outer lead bonding (OLB) process.

Figure 3:
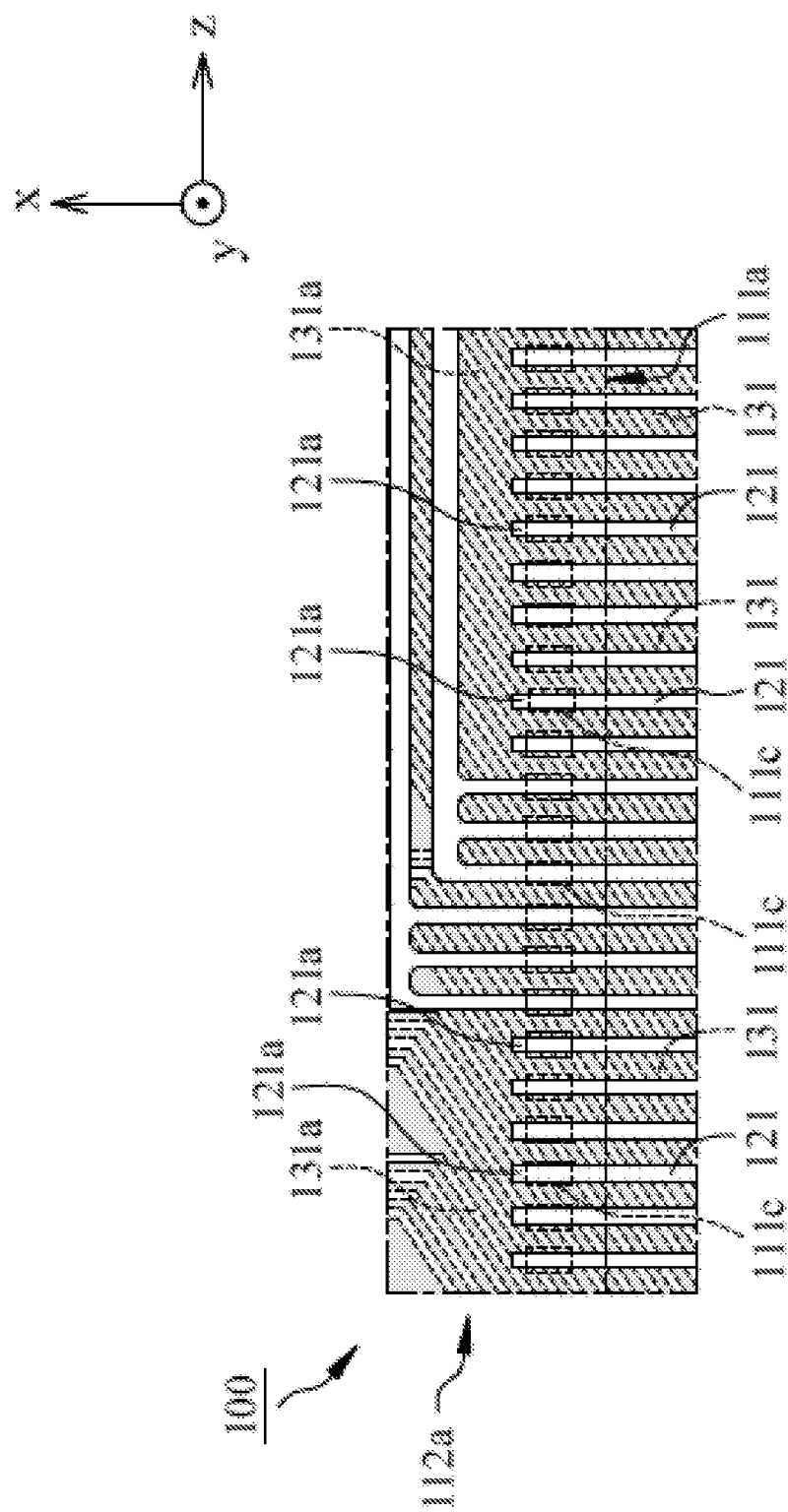
FIG. 3 is a partial schematic diagram illustrating a double-sided flexible circuit board in accordance with one embodiment of the present invention.

FIG. 3 is a partial schematic diagram showing the double-sided flexible circuit board 100 of the present invention. The region above the transverse line in FIG. 3 is the inner bonding region 111a of the first surface 111, and the first conductive lines 121 in the inner bonding region 111a are the inner leads 121a. In this embodiment, there are a plurality of bump mounting positions 111c in the inner bonding region 111a, and some or all of the inner leads 121a are located on the bump mounting positions 111c. The bumps 142 of the flip chip device 140 are aligned to the bump mounting positions 111c one to one, as a result, the bumps 142 are connected to the inner leads 121a when located on the bump mounting positions 111c.

With reference to FIGS. 2 and 3, a plurality of bump supporting regions 112c are defined on the second surface 112 by profiles of the bump mounting positions 111c within the inner bonding region 111a. Some or all of the inner supporting segments 131a are located on the bump supporting regions 112c, and each covers 40 to 60% of a total area of the bump supporting region 112c for providing sufficient support during ILB process. With reference to FIG. 3, a width difference between any two of the inner supporting segments 131a is preferably controlled to be smaller than 8 μm such that a height difference between any two of the inner supporting segments 131a can be controlled to be less than 2 μm because the smaller the width difference is, the smaller the height difference is. Consequently, the flexible substrate 110 has sufficient flatness and support for the flip chip device 140 during ILB process.

With reference to FIG. 2, a width difference between any two of the outer supporting segments 132a on the outer supporting region 112b is also preferably less than 60 μm to allow a height difference between any two of the outer supporting segments 132a to be less than 6 μm such that the flexible substrate 110 having excellent flatness is available for supporting the circuit device 150 during OLB process.

By narrowing down the width difference between any two of the inner supporting segments 131a on the inner supporting region 112a, the height of any one of the inner supporting segments 131a is similar to one another, for this reason, the inner supporting segments 131a have well flatness for thermal bonding head in ILB process.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A layout structure of double-sided flexible circuit board, comprising:
a flexible substrate including a first surface and a second surface, an inner bonding region is defined on the first surface, and an inner supporting region is defined on the second surface by a profile of the inner bonding region;
a first circuit layer located on the first surface and including a plurality of first conductive lines, each of the first conductive lines includes an inner lead which is located on the inner bonding region; and
a second circuit layer located on the second surface and including a plurality of second conductive lines, each of the second conductive lines includes an inner supporting segment which is located on the inner supporting region, wherein a width difference between any two of the inner supporting segment of the second conductive lines is less than 8 μm.

2. The layout structure of double-sided flexible circuit board in accordance with claim 1, wherein a height difference between any two of the inner supporting segment of the second conductive lines is less than 2 μm.

3. The layout structure of double-sided flexible circuit board in accordance with claim 1, wherein the inner bonding region includes a plurality of bump mounting positions, a part of the inner lead of the first conductive lines are located on the bump mounting positions, a plurality of bump supporting regions are defined on the second surface by profiles of the bump mounting positions, and a part of the inner supporting segment of the second conductive lines are located on the bump supporting regions, wherein the inner supporting segment on the bump supporting region covers 40 to 60% of a total area of the bump supporting region.

4. The layout structure of double-sided flexible circuit board in accordance with claim 1, wherein an outer bonding region is defined on the first surface and an outer supporting region is defined on the second surface by a profile of the outer bonding region, the second circuit layer further includes a plurality of third conductive lines, each of the third conductive lines includes an outer supporting segment which is located on the outer supporting region, and a width difference between any two of the outer supporting segment of the third conductive lines is less than 60 μm.

5. The layout structure of double-sided flexible circuit board in accordance with claim 4, wherein each of the second conductive lines and each of the third conductive lines are a same conductive line.

6. The layout structure of double-sided flexible circuit board in accordance with claim 4, wherein a height difference between any two of the outer supporting segment of the third conductive lines is less than 6 µm.

7. The layout structure of double-sided flexible circuit board in accordance with claim 4, wherein the first circuit layer further includes a plurality of fourth conductive lines, each of the fourth conductive lines includes an outer lead which is located on the outer bonding region.

8. The layout structure of double-sided flexible circuit board in accordance with claim 7, wherein each of the first conductive lines and each of the fourth conductive lines are a same conductive line.

9. The layout structure of double-sided flexible circuit board in accordance with claim 1, wherein the second conductive lines are a dummy pattern.

10. A double-sided flexible circuit board, comprising:
- a flexible substrate including a first surface and a second surface, an inner bonding region is defined on the first surface, and an inner supporting region is defined on the second surface by a profile of the inner bonding region;
- a first circuit layer located on the first surface and including a plurality of first conductive lines, each of the first conductive lines includes an inner lead which is located on the inner bonding region;
- a second circuit layer located on the second surface and including a plurality of second conductive lines, each of the second conductive lines includes an inner supporting segment which is located on the inner supporting region, wherein a width difference between any two of the inner supporting segment of the second conductive lines is less than 8 µm; and
- a flip chip device including a chip and a plurality of bumps, the bumps are electrically connected to the inner lead of the first conductive lines respectively, and the chip is electrically connected to the bumps.

11. The double-sided flexible circuit board in accordance with claim 10, wherein a height difference between any two of the inner supporting segment of the second conductive lines is less than 2 µm.

12. The double-sided flexible circuit board in accordance with claim 10, wherein the inner bonding region includes a plurality of bump mounting positions, a part of the inner lead of the first conductive lines are located on the bump mounting positions, a plurality of bump supporting regions are defined on the second surface by profiles of the bump mounting positions, and a part of the inner supporting segment of the second conductive lines are located on the bump supporting regions, wherein the inner supporting segment on the bump supporting region covers 40 to 60% of a total area of the bump supporting region.

13. The double-sided flexible circuit board in accordance with claim 10, wherein an outer bonding region is defined on the first surface and an outer supporting region is defined on the second surface by a profile of the outer bonding region, the second circuit layer further includes a plurality of third conductive lines, each of the third conductive lines includes an outer supporting segment which is located on the outer supporting region, and a width difference between any two of the outer supporting segment of the third conductive lines is less than 60 µm.

14. The double-sided flexible circuit board in accordance with claim 13, wherein each of the second conductive lines and each of the third conductive lines are a same conductive line.

15. The double-sided flexible circuit board in accordance with claim 13, wherein a height difference between any two of the outer supporting segment of the third conductive lines is less than 6 µm.

16. The double-sided flexible circuit board in accordance with claim 13, wherein the first circuit layer further includes a plurality of fourth conductive lines, each of the fourth conductive lines includes an outer lead which is located on the outer bonding region.

17. The double-sided flexible circuit board in accordance with claim 16, wherein each of the first conductive lines and each of the fourth conductive lines are a same conductive line.

18. The double-sided flexible circuit board in accordance with claim 10, wherein the second conductive lines are a dummy pattern.

\* \* \* \* \*